(12) United States Patent
    Song (10) Patent No.: US 10,795,499 B2
(45) Date of Patent: Oct. 6, 2020

(54) DISPLAY DEVICE AND METHOD OF CONTROLLING DISPLAY IMAGES OF DISPLAY DEVICE

(71) Applicant: Wuhan China Star Optoelectronics Semiconductor Display Technology Co., Ltd., Wuhan (CN)

(72) Inventor: Yuelong Song, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/342,986

(22) PCT Filed: Nov. 22, 2018

(86) PCT No.: PCT/CN2018/117017
§ 371 (c)(1),
(2) Date: Apr. 18, 2019

(87) PCT Pub. No.: WO2020/097967
PCT Pub. Date: May 22, 2020

(65) Prior Publication Data
US 2020/0150846 A1    May 14, 2020

(30) Foreign Application Priority Data
Nov. 13, 2018 (CN) .......................... 2018 1 1343908

(51) Int. Cl.
*G06F 3/041*  (2006.01)
*H05K 5/00*  (2006.01)
(Continued)

(52) U.S. Cl.
CPC ...... *G06F 3/04164* (2019.05); *G06F 3/04886* (2013.01); *H05K 5/0017* (2013.01);
(Continued)

(58) Field of Classification Search
USPC ........................................................ 345/173
See application file for complete search history.

(56) References Cited

U.S. PATENT DOCUMENTS 8,654,095 B1 *  2/2014  Cho ...................... G06F 3/0412
                                                345/173
2002/0109662 A1 *  8/2002  Miller .................. G06F 1/1641
                                                345/100
(Continued)

FOREIGN PATENT DOCUMENTS

CN    106354198    1/2017
CN    106504645    3/2017
(Continued)

*Primary Examiner* — Chineyere D Wills-Burns (57) ABSTRACT

A display device includes a flexible display panel. The flexible display device includes a first display portion, a second display portion, and a bendable portion. The bendable portion is configured to be bendable to allow the first display portion and the second display portion to be located at different planes. A sensor is disposed in the flexible display panel and configured to detect whether the bendable portion is bending. A control module is disposed in the flexible display panel and electrically connected to the sensor. The control module enables the first display portion to display a first image and enables the second display portion to display a second image when the sensor detects that the bendable portion is bending.

7 Claims, 5 Drawing Sheets

(51) Int. Cl.
  *G06F 3/0488* (2013.01)
  *H01L 27/32* (2006.01)
  *G06F 3/045* (2006.01)
  *H01L 51/00* (2006.01)
  *G06F 1/16* (2006.01)
  *H04M 1/02* (2006.01)

(52) U.S. Cl.
  CPC .... *G06F 3/045* (2013.01); *G06F 2203/04101* (2013.01); *G06F 2203/04102* (2013.01); *G06F 2203/04106* (2013.01); *H01L 27/3244* (2013.01); *H01L 51/0097* (2013.01); *H01L 2251/5338* (2013.01)

(56) References Cited

U.S. PATENT DOCUMENTS

| | | | | |
|---|---|---|---|---|
| 2008/0247128 | A1* | 10/2008 | Khoo | H04M 1/0214 361/679.04 |
| 2009/0096764 | A1* | 4/2009 | You | G06F 3/0412 345/174 |
| 2013/0086492 | A1* | 4/2013 | Sirpal | G06F 1/1618 715/761 |
| 2013/0215041 | A1* | 8/2013 | Kim | G06F 3/0346 345/173 |
| 2014/0267097 | A1* | 9/2014 | Lee | G06F 3/04886 345/173 |
| 2015/0194131 | A1* | 7/2015 | Kim | G09G 5/397 345/545 |
| 2015/0331496 | A1* | 11/2015 | Kwak | G06F 3/0487 345/156 |
| 2016/0179236 | A1* | 6/2016 | Shin | G06F 1/1616 345/173 |
| 2016/0246331 | A1* | 8/2016 | Cho | G06F 1/1652 |
| 2016/0299526 | A1* | 10/2016 | Inagaki | G02F 1/133305 |
| 2017/0023976 | A1 | 1/2017 | Xin et al. | |
| 2017/0023977 | A1 | 1/2017 | Xin et al. | |
| 2017/0045996 | A1* | 2/2017 | Ka | G06F 3/165 |
| 2017/0052566 | A1* | 2/2017 | Ka | G06F 1/1694 |
| 2017/0221456 | A1* | 8/2017 | Kim | H04M 1/72519 |
| 2017/0344120 | A1* | 11/2017 | Zuniga | G06F 3/0484 |
| 2018/0322848 | A1* | 11/2018 | Wu | G09G 5/00 |
| 2018/0330696 | A1 | 11/2018 | Cui | |
| 2019/0355299 | A1 | 11/2019 | Tan | |

FOREIGN PATENT DOCUMENTS

| | | |
|---|---|---|
| CN | 106558278 | 4/2017 |
| CN | 107170374 | 9/2017 |
| CN | 107564413 | 1/2018 |
| CN | 108666355 | 10/2018 |

\* cited by examiner

DISPLAY DEVICE AND METHOD OF CONTROLLING DISPLAY IMAGES OF DISPLAY DEVICE

RELATED APPLICATIONS

This application is a National Phase of PCT Patent Application No. PCT/CN2018/117017 having International filing date of Nov. 22, 2018, which claims the benefit of priority of Chinese Patent Application No. 201811343908.7 filed on Nov. 13, 2018. The contents of the above applications are all incorporated by reference as if fully set forth herein in their entirety.

FIELD AND BACKGROUND OF THE INVENTION

The present invention relates to a display technical field, and particularly to a display device and a method of controlling display images of the display device.

Whether used in personal mobile devices, such as mobile phones or tablets, or large-sized display devices, traditional displays are currently designed with hard panels, wherein liquid crystal display (LCD) displays are mainstream.

Organic light emitting diode (OLED) devices have advantages of being self-luminous, have rich colors, quick response times, wide viewing angles, and light weight, and have attracted wide attention because of their bendable characteristic. Different from traditional hard displays, flexible OLED panels can be designed with more diverse appearance, thereby to provide a different visual experience than hard displays. However, no matter hard or flexible displays, the currently trend of display improvement is focused on improving display performance, while there is little change in display patterns of the displays. Particularly, current flexible displays do not exhibit their flexibility characteristic over different display patterns, and present no difference from traditional LCD displays in user experience. Accordingly, it is imperative to improve display patterns of flexible displays to effectively exhibit the flexibility feature of the flexible displays.

SUMMARY OF THE INVENTION

An object of the present invention is to provide a flexible display device allowing users to view an individual display image on different orientations of the flexible display device when the flexible display panel is bent.

To achieve the above-mentioned object, the display device of the present invention comprises a flexible display panel comprising a first display portion, a second display portion, and a bendable portion connecting between the first display portion and the second display portion, the bendable portion configured to be bendable to allow the first display portion and the second display portion to be located at different planes; a sensor, disposed in the flexible display panel, and configured to detect whether the bendable portion is bending; and a control module, disposed in the flexible display panel, and electrically connected to the sensor, wherein the control module is configured to enable the first display portion to display a first image and to enable the second display portion to display a second image when the sensor detects that the bendable portion is bending.

In one preferable embodiment of the present invention, when the first display portion and the second display portion are coplanar with each other, the first display portion, the second display portion, and the bendable portion cooperatively display a full-sized image, wherein each of the first image and the second image has a size less than a size of the full-sized image, and the first image is identical to the second image.

In another preferable embodiment of the present invention, the sensor is a strain sensor disposed at an end portion of the bendable portion, the strain sensor comprises a curved portion and a wiring portion connecting to the curved portion, and the control module is electrically connected with the wiring portion, wherein the control module stores a predetermined resistance value, and the curved portion generates a varied resistance value when the bendable portion is bending, and wherein when the varied resistance value is different from the predetermined resistance value, the control module enables the first display portion to display the first image and enables the second display portion to display the second image.

In another preferable embodiment of the present invention, the sensor is a range sensor comprising a transmitter disposed on the first display portion and a receiver disposed on the second display portion, the receiver is configured to receive signals transmitted from the transmitter, and the control module stores a predetermined distance threshold and is connected to the range sensor, wherein according to the signals the control module generates a distance value corresponding to a distance between the transmitter and the receiver, and wherein when the distance value is different from the predetermined distance threshold, the control module enables the first display portion to display the first image and enables the second display portion to display the second image.

In another preferable embodiment of the present invention, the bendable portion of the flexible display panel is further configured to display a third image different from the first image and the second image.

In another preferable embodiment of the present invention, the display device further comprises a touch film layer disposed on the flexible display panel and covering the first display portion, the second display portion, and the bendable portion; wherein the touch film layer has a region corresponding to the bendable portion and configured to receive a touch to control and switch contents of the first image and the second image.

The present invention further provides a method of controlling display images of a display device, comprising: forming a first display portion, a second display portion, and a bendable portion disposed between the first display portion and the second display portion, the bendable portion configured to be bendable to allow the first display portion and the second display portion to be located at different planes; providing a sensor disposed in the flexible display panel and configured to detect whether the bendable portion is bending; providing a control module disposed in the flexible display panel and electrically connected to the sensor; and the control module configured to enable the first display portion to display a first image and to enable the second display portion to display a second image when the sensor detects that the bendable portion is bending, wherein when the first display portion and the second display portion are coplanar with each other by bending the bendable portion, the first display portion, the second display portion, and the bendable portion cooperatively display a full-sized image, wherein each of the first image and the second image has a size less than a size of the full-sized image, and the first image is identical to the second image.

In another preferable embodiment of the present invention, the sensor is a strain sensor disposed at an end portion of the bendable portion, the strain sensor comprises a curved portion and a wiring portion connecting to the curved portion, and the control module is electrically connected with the wiring portion, wherein the control module stores a predetermined resistance value, and the curved portion is configured to generate a varied resistance value when the bendable portion is bending, and wherein when the varied resistance value is different from the predetermined resistance value, the control module enables the first display portion to display the first image and enables the second display portion to display the second image.

In another preferable embodiment of the present invention, the sensor is a range sensor comprising a transmitter disposed on the first display portion and a receiver disposed on the second display portion, the receiver is configured to receive signals transmitted from the transmitter, and the control module stores a predetermined range threshold and is connected to the range sensor, wherein according to the signals the control module generates a range value corresponding to a distance between the transmitter and the receiver, and wherein when the distance value is different from the predetermined distance threshold, the control module enables the first display portion to display the first image and enables the second display portion to display the second image.

In another preferable embodiment of the present invention, the bendable portion of the flexible display panel is further configured to display a third image different from the first image and the second image.

The present invention further provides a display device, comprising: a flexible display panel comprising a first display portion, a second display portion, and a bendable portion connecting between the first display portion and the second display portion, the bendable portion configured to be bendable to allow the first display portion and the second display portion to be located at different planes, and the bendable portion extending to opposite two sides of the flexible display panel and located at a middle of the flexible display panel; a sensor, disposed in the flexible display panel, and configured to detect whether the bendable portion is bending; and a control module, disposed in the flexible display panel, and electrically connected to the sensor, wherein the control module is configured to enable the first display portion to display a first image and to enable the second display portion to display a second image when the sensor detects that the bendable portion is bending.

In one preferable embodiment of the present invention, the sensor is a strain sensor disposed at an end portion of the bendable portion, the strain sensor comprises a curved portion and a wiring portion connecting to the curved portion, and the control module is electrically connected with the wiring portion, wherein the control module stores a predetermined resistance value, and the curved portion generates a varied resistance value when the bendable portion is bending, and wherein when the varied resistance value is different from the predetermined resistance value, the control module enables the first display portion to display the first image and enables the second display portion to display the second image.

In another preferable embodiment of the present invention, the sensor is a range sensor comprising a transmitter disposed on the first display portion and a receiver disposed on the second display portion, the receiver is configured to receive signals transmitted from the transmitter, and the control module stores a predetermined distance threshold and is connected with the range sensor, wherein according to the signals the control module generates a distance value corresponding to a distance between the transmitter and the receiver, and wherein when the distance value is different from the predetermined distance threshold, the control module enables the first display portion to display the first image and enables the second display portion to display the second image.

In another preferable embodiment of the present invention, the bendable portion of the flexible display panel is further configured to display a third image different from the first image and the second image.

In another preferable embodiment of the present invention, the display device further comprises a touch film layer disposed on the flexible display panel and covering the first display portion, the second display portion, and the bendable portion; wherein the touch film layer has a region corresponding to the bendable portion and configured to receive a touch to control and switch contents of the first image and the second image.

The display device of the present invention utilizes the sensor to detect a bending state of the display device, so that the control module is capable of enabling the first display portion and the second display portion to display the first image and the second image containing same contents, respectively, when the display device is bending. When the display device is back to the flat state, the control module enables the first display portion, the second display portion, and the bendable portion to cooperatively display the full-sized image. Because the first display portion and the second display portion, after the display device is bent, are enabled to display an individual image, respectively, the display device of the present invention allows users to view images containing same contents from different orientations of the display device, thereby to provide a variety of usage patterns of the display device for users, and thus effectively overcoming drawbacks that traditional displays merely can display a single display image.

DESCRIPTION OF SPECIFIC EMBODIMENTS OF THE INVENTION

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 1:
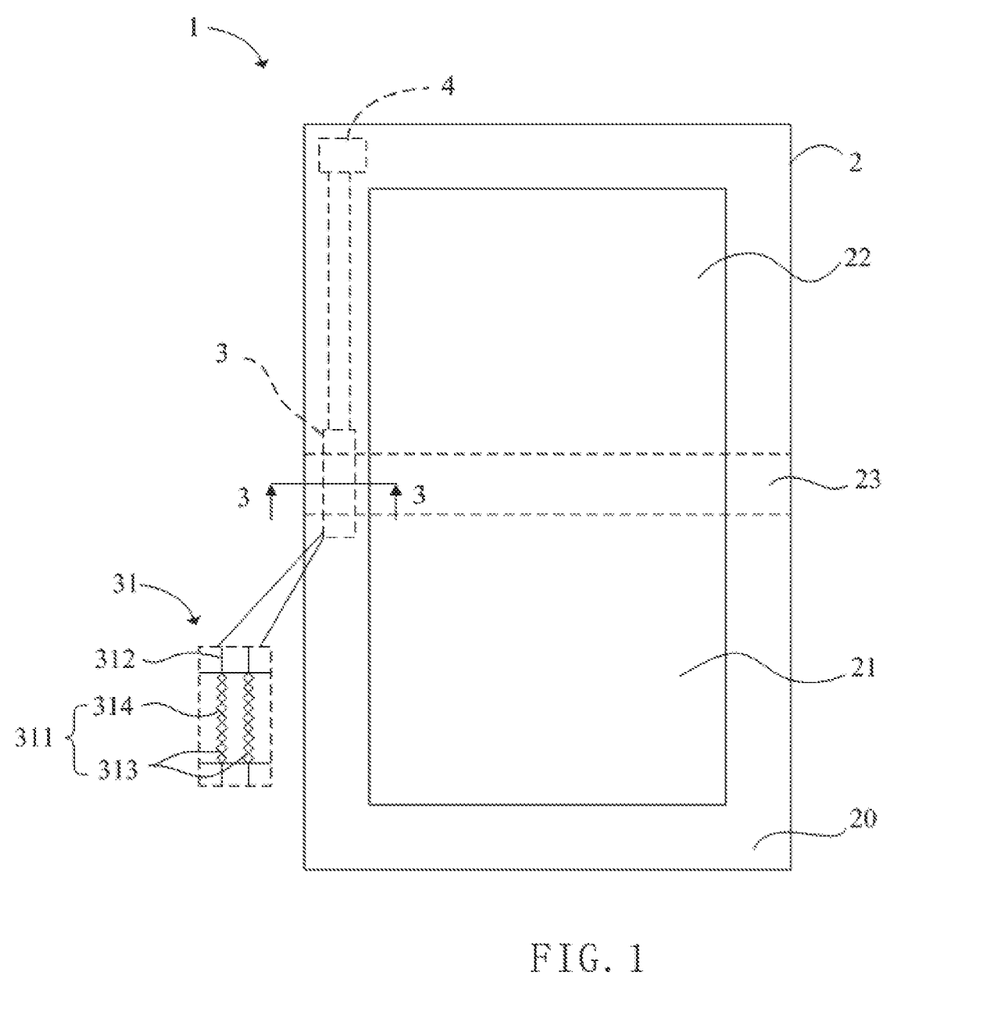
FIG. 1 is a schematic plan view of a display device in accordance with a preferable embodiment of the present invention.
Figure 2:
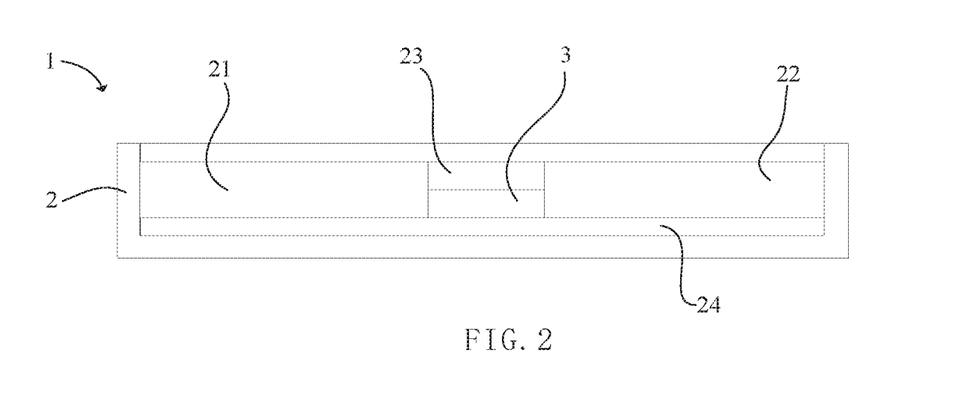
FIG. 2 is a schematic cross-sectional view of FIG. 1.

The present invention discloses a bendable flexible display device. In this preferable embodiment, the flexible display device is an organic light emitting diode (OLED) display device. FIG. 1 is a schematic plan view of a display device in accordance with the preferable embodiment of the present invention. FIG. 2 is a schematic cross-sectional view of FIG. 1. A display device 1 of the present invention includes a flexible display panel 2, a sensor 3, and a control module 4. The flexible display panel 2 includes a first display portion 21, a second display portion 22, a bendable portion 23 connecting between the first display portion 21 and the second display portion 22, and a border frame 20 surrounding the first display portion 21, the second display portion 22, and the bendable portion 23. The bendable portion 23 extends to opposite two sides of the flexible display panel 2 and is located at a middle of the flexible display panel 2.

As shown in FIGS. 1 and 2, the sensor 3 is disposed in an end portion of the bendable portion 23, i.e. a non-display area. The control module 4 is disposed on a substrate 24 close to the border frame 20 and electrically connected to the sensor 3. Specifically, the control module 4 is correspondingly located at an end portion of the flexible display panel 2, i.e. the non-display area. Particularly, in this embodiment, the control module 4 has a processor storing a predetermined resistance value.

Figure 3:
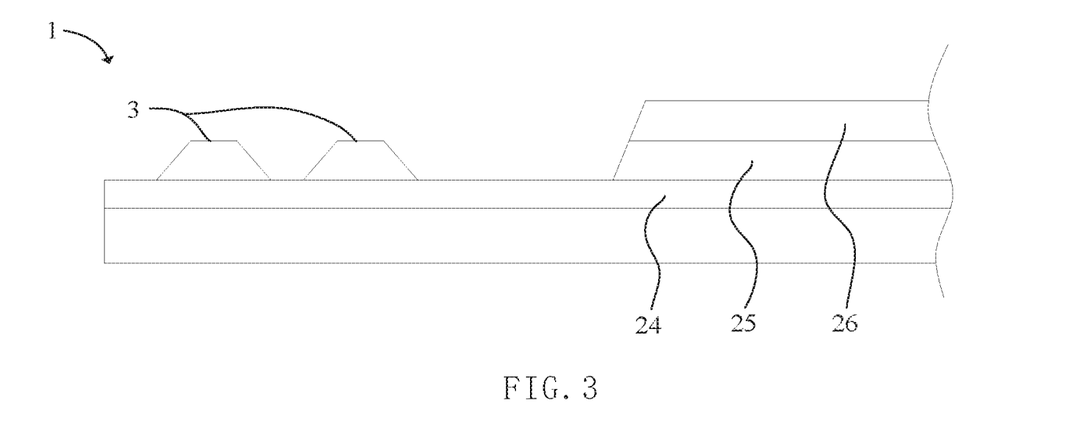
FIG. 3 is a schematic and partially structural cross-sectional view taken along line 3-3 of the display device of FIG. 1.

FIG. 3 is a schematic and partially structural cross-sectional view taken along line 3-3 of the display device of FIG. 1. The flexible display panel 2 of the present invention includes the flexible substrate 24, a thin-film transistor (TFT) layer 25 formed on the flexible substrate 24, and an organic light emitting layer 26 disposed on the TFT layer 25. The flexible substrate 24 is configured to support and protect each component of the display device 1. The flexible substrate 24 is made of a flexible insulating material, such as polyimide, but is not limited thereto. The TFT layer 25 includes a source electrode, a drain electrode, and a gate electrode (not shown) and other components related to TFTs.

Please continue referring to FIGS. 3 and 1. In this preferable embodiment, the sensor 3 is disposed on the flexible substrate 24 (as shown in FIG. 3) and is exemplified as a strain sensor 31. The strain sensor 31 includes a curved portion 311 and a wiring portion 312 connecting to the curved portion 311 (as shown in FIG. 1), and the control module 4 is electrically connected with the wiring portion 312. Specifically, the curved portion 311 includes at least two lines 313, each of the two lines 313 includes a plurality of strain units 314 interconnected in rows, and each of the strain units 314 is configured with a geometric shaped line. The at least two lines 313 are parallel with each other. The wiring portion 312 includes at least two wires, one end of the at least two wires are connected to the at least two lines 313 of the curved portion 311, and the other end of the at least two wires are connected to the control module 4.

The first display portion 21 and the second display portion 22 of the present invention are non-bendable portions, and the bendable portion 23 is bendable. As shown in FIG. 1, when the display device 1 of the present invention is in an unbent state, the first display portion 21, the second display portion 22, and the bendable portion 23 cooperatively form a flat shape, and are coplanar with each other. The first display portion 21, the second display portion 22, and the bendable portion 23 cooperatively display a full-sized image. That is, the full-sized image is not divided.

Figure 4:
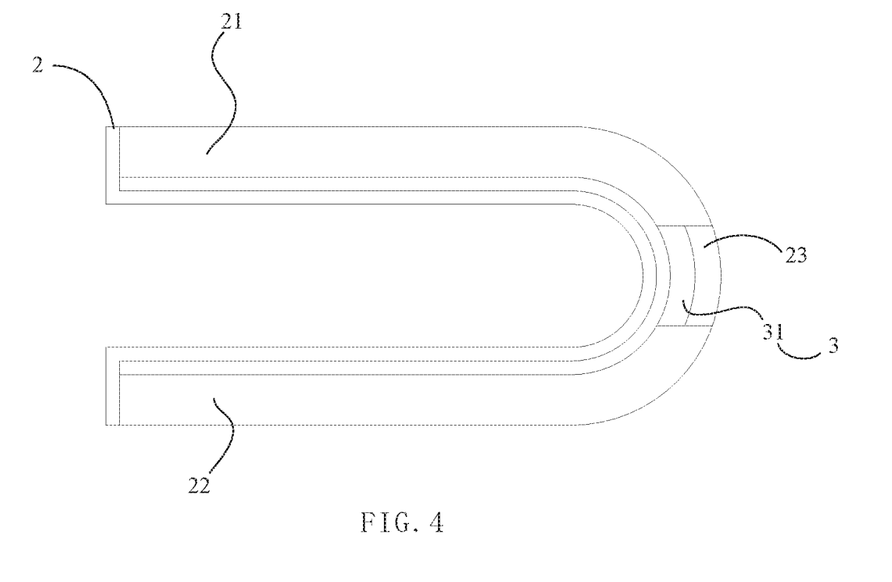
FIG. 4 is a schematic side view of the display device of FIG. 1, where the display device is bent.
Figure 5:
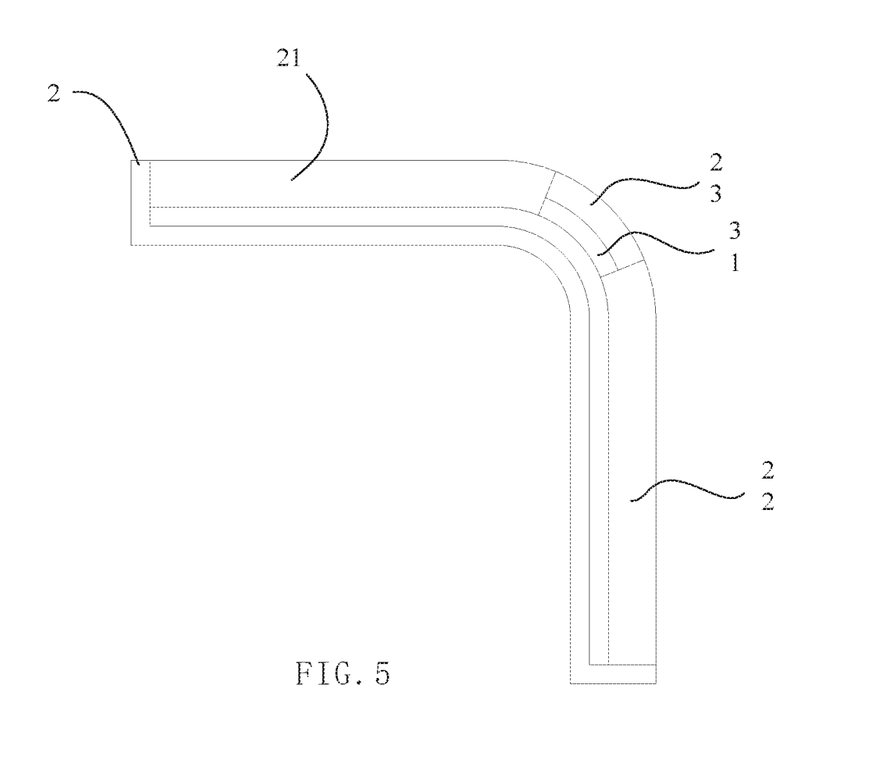
FIG. 5 is another schematic side view of the display device of FIG. 1, where the display device is bent.

FIGS. 4 and 5 both are schematic side views of the display device of FIG. 1, where the display device 1 is bent. As shown in FIGS. 4 and 5, the display device 1 is capable of being bent to 90-180 degrees. As shown in FIG. 4, when the display device 1 is bent, the bendable portion 23 is deformed to bend, enabling the first display portion 21 or/and the second display portion 22 to move axially so that the first display portion 21 and the second display portion 22 are located at different planes. In this embodiment, when the bendable portion 23 is bending, the curved portion 311 of the strain sensor 31 is concurrently bent and generates a varied resistance value. When the varied resistance value is different from the predetermined resistance value stored in the control module 4, the control module 4 enables the first display portion 21 to display the first image and enables the second display portion 22 to display the second image, wherein the first image and the second image both have a size less than a size of the full-sized image, and the first image is identical to the second image. Furthermore, when the bendable portion 23 is bent to back to a state where the display device 1 is not bent such that the display device 1 is in a flat shape, the varied resistance value is same as the predetermined resistance value, and the first display portion 21, the second display portion 22, and the bendable portion 23 cooperatively display a full-sized image.

Furthermore, the bendable portion 23 of the flexible display panel 2 is further configured to display a third image different from the first image and the second image. In another preferable embodiment, the display device 1 further includes a touch film layer 27 (as shown in FIG. 2) disposed on the flexible display panel 2 and covering the first display portion 21, the second display portion 22, and the bendable portion 23. Particularly, the touch film layer 27 has a region corresponding to the bendable portion 23 and configured to receive a touch to control and switch contents of the first image and the second image. For example, the content of the third image contains different icons for switching the contents of the first display portion 21 and the second display portion 22.

As described above, the display device 1 of the present invention utilizes the sensor 3 to detect a bending state of the display device 1, so that the control module 4 is capable of enabling the first display portion 21 and the second display portion 22 to display the first image and the second image containing same contents, respectively, when the display device 1 is bending. When the display device 1 is back to the flat state, the control module 4 enables the first display portion 21, the second display portion 22, and the bendable portion 23 to cooperatively display the full-sized image. Because the first display portion and the second display portion, after the display device is bent, are enabled to display an individual image, respectively, the display device of the present invention allows users to view images containing same contents from different orientations of the display device, thereby to provide a variety of usage patterns of the display device for users, and thus effectively overcoming drawbacks that traditional displays merely can display a single display image.

Figure 6:
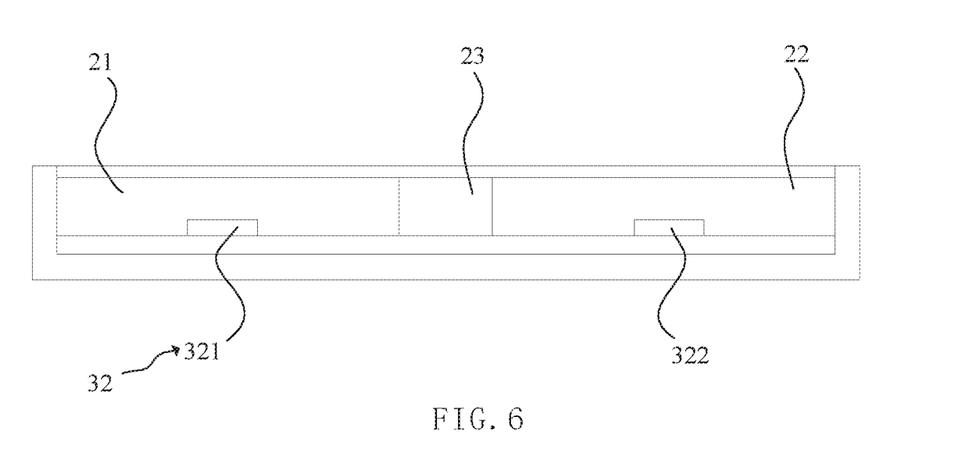
FIG. 6 is a schematic cross-sectional view of a display device in accordance with another embodiment of the present invention.
Figure 7:
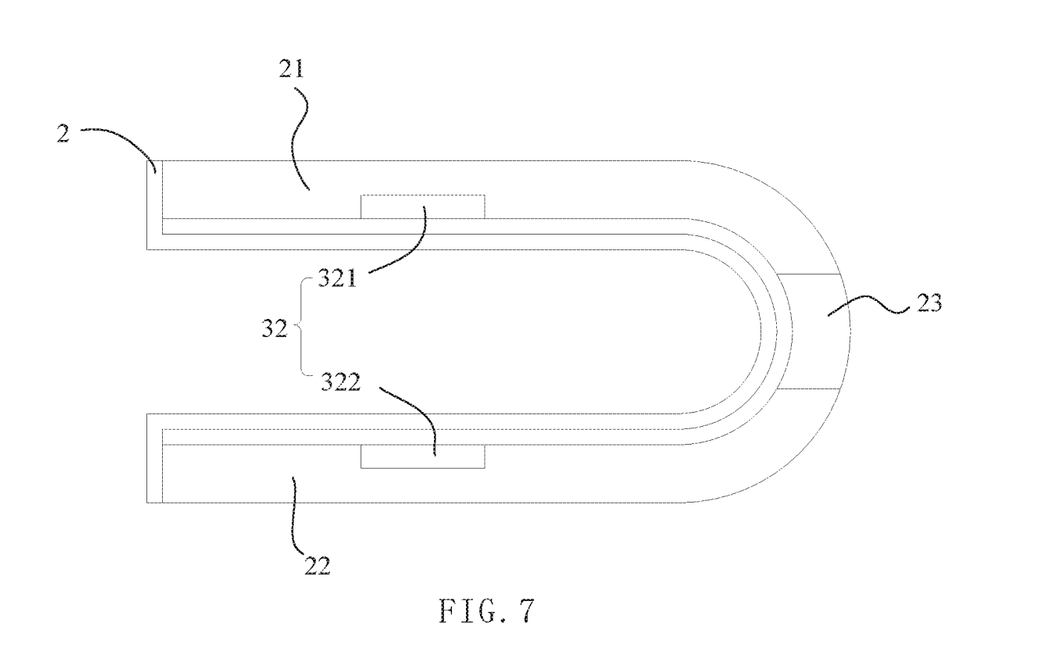
FIG. 7 is a schematic side view of the display device of FIG. 6, where the display device is bent.

FIG. 6 is a schematic cross-sectional view of a display device in accordance with another embodiment of the present invention. FIG. 7 is a schematic side view of the display device of FIG. 6, where the display device is bent. The differences between the embodiment and the previous embodiment lie in that, in this embodiment, the sensor 3 is exemplified as a range sensor 32 (as shown in FIG. 6).

Specifically, the range sensor 32 includes a transmitter 321 disposed on the first display portion 21, and a receiver 322 disposed on the second display portion 22. The receiver 322 is configured to receive signals transmitted from the transmitter 321. The control module 4 stores a predetermined distance threshold and is connected to the range sensor 32. According to the signals the control module 4 generates a distance value corresponding to a distance between the transmitter 321 and the receiver 322. When the distance value is different from the predetermined distance threshold, the control module 4 enables the first display portion 21 to display the first image and enables the second display portion 22 to display the second image.

Particularly, the distance sensor 32 can be a generally known infrared distance sensor, an optical distance sensor, or an ultrasonic distance sensor.

Figure 8:
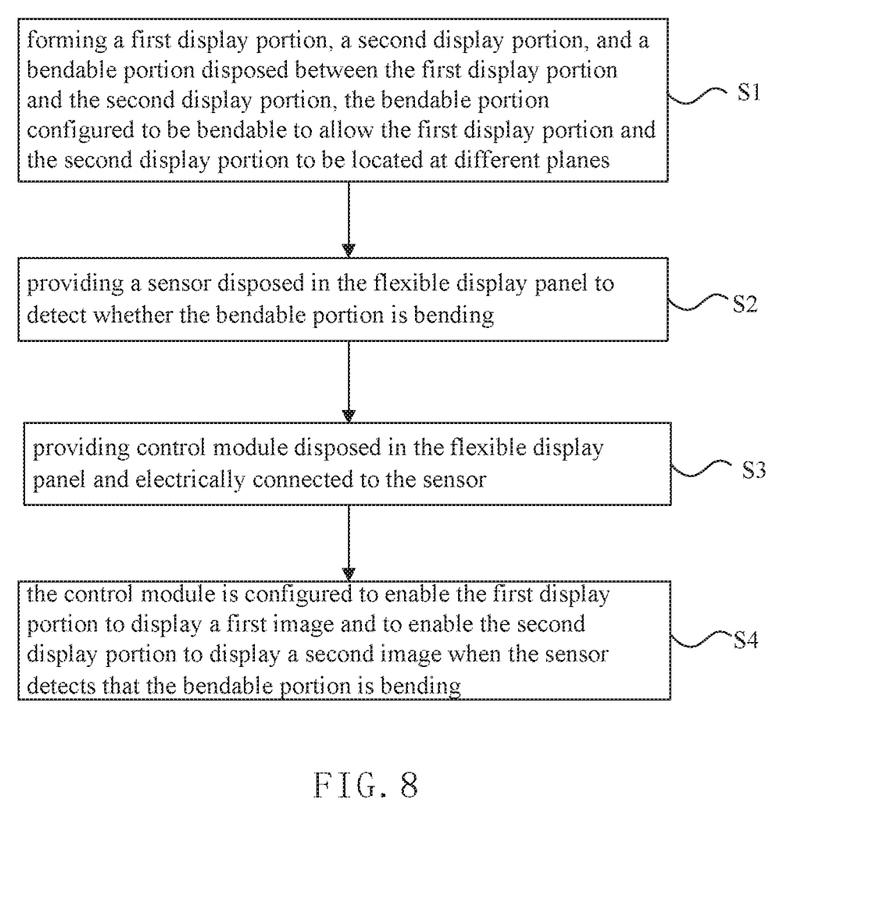
FIG. 8 is a flowchart showing a method of controlling display images of a display device of the present invention.

FIG. 8 is a flowchart showing a method of controlling display images of a display device of the present invention. The method of controlling display images of the display device mainly includes following steps: step S1: forming a first display portion, a second display portion, and a bendable portion disposed between the first display portion and the second display portion, the bendable portion configured to be bendable to allow the first display portion and the second display portion to be located at different planes.

Step S2: providing a sensor disposed in the flexible display panel and configured to detect whether the bendable portion is bending.

Step S3: providing a control module disposed in the flexible display panel and electrically connected to the sensor.

Step S4: the control module configured to enable the first display portion to display a first image and to enable the second display portion to display a second image when the sensor detects that the bendable portion is bending.

In accordance with the method of controlling display images of the display device of the present invention, when the first display portion and the second display portion are coplanar with each other by bending the bendable portion, the first display portion, the second display portion, and the bendable portion cooperatively display a full-sized image, wherein each of the first image and the second image has a size less than a size of the full-sized image, and the first image is identical to the second image. Furthermore, the bendable portion of the flexible display panel is further configured to display a third image different from the first image and the second image.

In the method of controlling display images of the display device of the present invention, various structural elements relating to the display device are the same as those of the display device described in the foregoing embodiments, and will not be repeatedly described herein.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A display device, comprising:
a flexible display panel comprising a first display portion, a second display portion, and a bendable portion connecting between the first display portion and the second display portion, the bendable portion configured to be bendable to allow the first display portion and the second display portion to be located at different planes;
a sensor, disposed in the flexible display panel, and configured to detect whether the bendable portion is bending; and
a control module, disposed in the flexible display panel, and electrically connected to the sensor,
wherein the control module is configured to enable the first display portion to display a first image and to enable the second display portion to display a second image when the sensor detects that the bendable portion is bending, and when the first display portion and the second display portion are coplanar with each other, the first display portion, the second display portion, and the bendable portion cooperatively display a full-sized image, wherein each of the first image and the second image has a size less than a size of the full-sized image, and the first image is identical to the second image;
wherein the bendable portion is located at a middle of the flexible display panel and is further configured to display a third image different from the first image and the second image.

2. The display device of claim 1, wherein the sensor is a strain sensor disposed at an end portion of the bendable portion, the strain sensor comprises a curved portion and a wiring portion connecting to the curved portion, and the control module is electrically connected with the wiring portion, wherein the control module stores a predetermined resistance value, and the curved portion generates a varied resistance value when the bendable portion is bending, and wherein when the varied resistance value is different from the predetermined resistance value, the control module enables the first display portion to display the first image and enables the second display portion to display the second image.

3. The display device of claim 1, wherein the sensor is a range sensor comprising a transmitter disposed on the first display portion and a receiver disposed on the second display portion, the receiver is configured to receive signals transmitted from the transmitter, and the control module stores a predetermined distance threshold and is connected to the range sensor, wherein according to the signals the control module generates a distance value corresponding to a distance between the transmitter and the receiver, and wherein when the distance value is different from the predetermined distance threshold, the control module enables the first display portion to display the first image and enables the second display portion to display the second image.

4. The display device of claim 1, further comprising a touch film layer disposed on the flexible display panel and covering the first display portion, the second display portion, and the bendable portion; wherein the touch film layer has a region corresponding to the bendable portion and configured to receive a touch to control and switch contents of the first image and the second image.

5. A method of controlling display images of a display device, comprising:
forming a first display portion, a second display portion, and a bendable portion disposed between the first display portion and the second display portion, the bendable portion configured to be bendable to allow the first display portion and the second display portion to be located at different planes;
providing a sensor, disposed in the flexible display panel, and configured to detect whether the bendable portion is bending;

providing a control module, disposed in the flexible display panel, and electrically connected to the sensor; and the control module configured to enable the first display portion to display a first image and to enable the second display portion to display a second image when the sensor detects that the bendable portion is bending, wherein when the first display portion and the second display portion are coplanar with each other by bending the bendable portion, the first display portion, the second display portion, and the bendable portion cooperatively display a full-sized image, wherein each of the first image and the second image has a size less than a size of the full-sized image, and the first image is identical to the second image;

wherein the bendable portion is located at a middle of the flexible display panel and is further configured to display a third image different from the first image and the second image.

6. The method of controlling display images of claim 5, wherein the sensor is a strain sensor disposed at an end portion of the bendable portion, the strain sensor comprises a curved portion and a wiring portion connecting to the curved portion, and the control module is electrically connected with the wiring portion, wherein the control module stores a predetermined resistance value, and the curved portion is configured to generate a varied resistance value when the bendable portion is bending, and wherein when the varied resistance value is different from the predetermined resistance value, the control module enables the first display portion to display the first image and enables the second display portion to display the second image.

7. The method of controlling display images of claim 5, wherein the sensor is a range sensor comprising a transmitter disposed on the first display portion and a receiver disposed on the second display portion, the receiver is configured to receive signals transmitted from the transmitter, and the control module stores a predetermined range threshold and is connected to the range sensor, wherein according to the signals the control module generates a range value corresponding to a distance between the transmitter and the receiver, and wherein when the distance value is different from the predetermined distance threshold, the control module enables the first display portion to display the first image and enables the second display portion to display the second image.

* * * * *